United States Patent [19]

Fuse

[11] Patent Number: 4,527,007
[45] Date of Patent: Jul. 2, 1985

[54] PROCESS FOR FORMING PASSIVATION FILM ON PHOTOELECTRIC CONVERSION DEVICE AND THE DEVICE PRODUCED THEREBY

[75] Inventor: Mario Fuse, Ebina, Japan
[73] Assignee: Fuji Xerox Co., Ltd., Tokyo, Japan
[21] Appl. No.: 573,875
[22] Filed: Jan. 25, 1984

[30] Foreign Application Priority Data

Feb. 2, 1983 [JP] Japan .................. 58-15832

[51] Int. Cl.$^3$ .................. H01L 31/04; H01L 31/18
[52] U.S. Cl. .................. 136/256; 29/572;
357/30; 357/52; 357/72; 357/73; 427/39;
427/74; 427/95; 136/258
[58] Field of Search .................. 136/256, 258 AM;
357/30, 52, 72–73; 427/39, 74, 95; 29/572

[56] References Cited

U.S. PATENT DOCUMENTS 3,990,100 11/1976 Mamine et al. .................. 357/30
4,379,943 4/1983 Yang et al. .................. 136/249
4,410,558 10/1983 Izu et al. .................. 427/39

FOREIGN PATENT DOCUMENTS 56-43776 4/1981 Japan .................. 136/256

OTHER PUBLICATIONS

J. R. Hollahan, "Deposition of Plasma Silicon Oxide Thin Films in a Production Planar Reactor", *J. Electrochem. Soc.*, vol. 126, pp. 930–934, (1979).
A. C. Adams et al., "Characterization of Plasma-Deposited Silicon Nitride", *J. Electrochem. Soc.*, vol. 128, pp. 1545–1551, (1981).

*Primary Examiner*—Aaron Weisstuch
*Attorney, Agent, or Firm*—Michael N. Meller

[57] ABSTRACT

In a process for producing a photoelectric conversion device having a junction between hydrogenated amorphous silicon and an electrode made of ITO or the like, on the surface of which a passivation film made of silicon oxide is provided, the passivation film being formed by the plasma CVD method in an atmosphere of mixed gas prepared by admixing an excess of oxygen-containing gas, such as nitrous oxide, carbon dioxide, oxygen, or the like, with silane gas. The surface of the photoelectric conversion device is covered with a silicon oxide film formed in accordance with the plasma CVD method at a temperature of less than 300° C. in an atmosphere of mixed gas consisting of silane gas and an excess of oxygen-containing gas.

6 Claims, 3 Drawing Figures

PROCESS FOR FORMING PASSIVATION FILM ON PHOTOELECTRIC CONVERSION DEVICE AND THE DEVICE PRODUCED THEREBY

BACKGROUND OF THE INVENTION

1. Field of the Invention

This invention relates to a process for producing a photoelectric conversion device and to the photoelectric conversion device produced thereby. Particularly, the present invention relates to a process for forming a passivation film made of silicon oxide on a photoelectric conversion device having a junction between hydrogenated amorphous silicon and ITO (indium-tin oxide).

2. Description of the Prior Art

A photoelectric conversion device has been utilized as an image sensor for reading an original in facsimile equipment and the like.

FIG. 1 is a sectional view showing a conventional image sensor 1 constructed by the steps of forming a lower electrode 3 on an insulating substrate 2 so as to cover a part of the lower electrode 3, and providing a transparent upper electrode 5 on the hydrogenated amorphous silicon film 4.

Material for the insulating substrate 2 may be ceramics, glass, or plastics. Such insulating substrate must be of high mechanical strength and of high heat resistance so as not to be softened by heat which is applied to the substrate during manufacturing of the image sensor 1. In addition, high insulating properties are also required.

The lower electrode 3 is made of metal such as chromium (Cr), nickel (Ni), platinum (Pt), palladium (Pd), titanium (Ti), molybdenum (Mo), or tantalum (Ta), and is prepared, for example, by applying the metal in the form of a film having a thickness of 500 Å to 5000 Å onto the substrate 2. The metal coating is then subjected to photolithography and etching so as to be of suitable size and shape. As the hydrogenated amorphous silicon film 4, an undoped silicon film, a p-type silicon film doped with an element such as boron (B) or the like belonging to group III of the periodic table, or a like silicon film is employed. As a process for forming the amorphous silicon film 4, for example, the plasma CVD method has been adopted to deposit the film having a thickness of around 1 μm.

For the transparent upper electrode 5, an ITO film is employed and the transparent upper electrode 5 is formed with a thickness of around 500 Å to 2000 Å in accordance with, for instance, a reactive deposition process, a reactive sputtering process or a like process.

The image sensor 1 having the above-mentioned laminated construction possesses excellent characteristic properties. For example, the ratio between light current and dark current (light/dark current ratio) is $10^3$ or more and the response time to a light pulse is 1 ms or less.

In this connection, the dark current is suppressed by means of an electron barrier layer (not shown) formed at the boundary of the amorphous silicon film 4 and the transparent upper electrode 5, and such an electron barrier layer is one of the factors determining the light-/dark current ratio.

The image sensor 1 as described above has heat and humidity resistance which is not deteriorated even after annealing in air at 250° C. for 1 hour under 1 atm of pressure, or even after auto-clave testing at 120° C. for 30 minutes under 2 atm of pressure.

However, there has arisen problems of deterioration in the image sensor due to the staining of the transparent upper electrode 5 for receiving light and/or staining or abrasion by the mechanical contact of the image sensor 1 in the case where the image sensor is used in a picture information processor such as facsimile equipment or the like.

Furthermore, the image sensor 1 may decrease in its insulation properties when condensed water is produced on the image sensor.

SUMMARY OF THE INVENTION

In order to eliminate the disadvantages of the prior art as mentioned above, it is an object of the present invention to provide a process for producing a photoelectric conversion device on the surface of which a passivation film made of silicon oxide is formed to prevent deterioration in performance of the photoelectric conversion device, and at the same time to maintain favorable insulating properties. It is an another object of the present invention to provide a photoelectric conversion device made by the above process.

Meanwhile, known processes for forming a silicon oxide film, as a passivation film, on the surface of a photoelectric conversion device, include the plasma chemical vapor deposition (CVD), atmospheric pressure CVD, sputtering, spin coating, etc. Of these methods, the plasma CVD method is most desirable wherein a low temperature process treatment of 400° C. or less can be effected at the time of forming the passivation film, because there occurs evolution of hydrogen which has been bonded with silicon atoms when the hydrogenated amorphous silicon film is heated at a temperature of 400° C. or more.

The plasma CVD method comprises the steps of placing a substrate, on which a thin film is to be formed, in a reaction chamber, introducing a reactive gas for forming the film and, if required, a carrier gas for suitably circulating the reactive gas into the reaction chamber, establishing glow discharge by means of an appropriate dc or ac voltage to dissociate and partly ionize the reactive gas, and depositing the reactive gas, thus dissociated and partly ionized on the substrate as a thin film.

In the plasma CVD method, however, since most of the reactive gases require a smaller dissociation energy than ionization energy, the ionization rate is slower than the generation rate of active seeds (radicals) causing reaction and positive ion recombination with electrons, whereby many neutral radicals such as hydrogen radicals are caused to be generated in plasma. In other words, active seeds have longer lives than ions, and therefore hydrogen radicals contained in silane gas react with ITO at an early stage of growth of the silicon oxide film in film formation according to the plasma CVD method. As a result, the transparent upper electrode (ITO film) changes in quality, so that the junction between the transparent electrode and the hydrogenated amorphous silicon deteriorates. Accordingly, a significant decrease in the light/dark current ratio will take place due to the increase in dark current.

Accordingly, in the present invention a reactive gas containing a large amount of oxygen is mixed with a small amount of silane gas, and a silicon oxide film is formed on the surface of a photoelectric conversion device in the resulting mixed gas atmosphere in accordance with the plasma CVD method. Thus, it becomes possible to form a passivation film composed of silicon oxide without accompanying deterioration in the properties of the device such as an increase in the dark current.

The present invention provides a process for producing a photoelectric conversion device having a junction between hydrogenated amorphous silicon and an electrode made of ITO or the like, on the surface of which a passivation film made of silicon oxide is provided, wherein the passivation film made of silicon oxide is formed by a plasma CVD method in an atmosphere of mixed gas prepared by admixing an excess of oxygen-containing gas such as nitrous oxide, carbon dioxide, oxygen or the like with silane gas.

The present invention also provides a photoelectric conversion device having a junction between hydrogenated amorphous silicon and ITO, the surface of said photoelectric conversion device being covered with a silicon oxide film formed in accordance with the plasma CVD method in an atmosphere of mixed gas consisting of silane gas and an excess of gas containing oxygen.

DESCRIPTION OF THE PREFERRED EMBODIMENT

Figure 1:
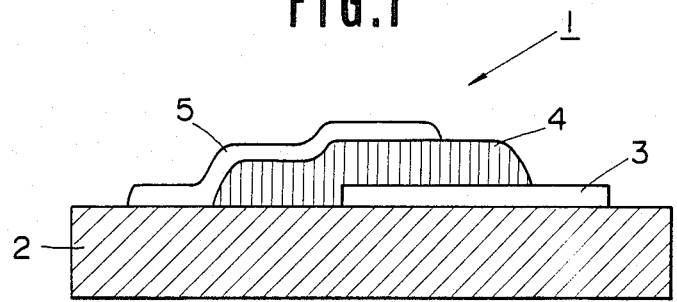
FIG. 1 is a cross-sectional view showing a conventional image sensor.
Figure 2:
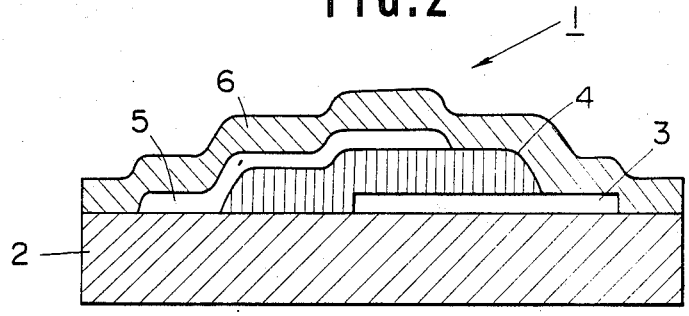
FIG. 2 is a cross-sectional view showing an image sensor produced by the process according to the present invention.

FIG. 2 is a cross-sectional view showing an image sensor produced by the process in accordance with the present invention wherein like parts are identified by the same reference numerals as FIG. 1.

As shown in FIG. 2, an image sensor 1 has a construction obtained by forming a lower electrode 3 on a glass substrate 2, depositing a hydrogenated amorphous silicon film 4 onto the glass substrate 2 so as to cover a part of the lower electrode 3, depositing a transparent upper electrode 5 on the substrate 2 so as to partly cover the hydrogenated amorphous silicon film 4, and further covering the whole surface, except for portions of the substrate 2 corresponding to terminals (not shown) for the transparent upper and lower electrodes 5 and 3, with a silicon oxide film 6.

Now, a process for producing the image sensor 1 of the present invention will be detailed.

First, chromium is deposited on the whole surface of the glass substrate 2 with a thickness of 3000 Å and photoetched to form the lower electrode 3 having a suitable shape and size. The amorphous silicon film 4 is formed in such a manner that silane gas is dissociated by means of glow discharge to deposit hydrogenated amorphous silicon with a thickness of about 1 μm. Then, the transparent upper electrode 5 is prepared by depositing an ITO film with a thickness of about 1500 Å in an argon and oxygen atmosphere by dc sputtering. Furthermore, portions of the external connecting terminals (not shown) for the lower electrode 3 and the transparent upper electrode 5 are covered with a metal mask.

The silicon oxide film 6 is formed on the top surface of the image sensor 1 using the plasma CVD method.

Figure 3:
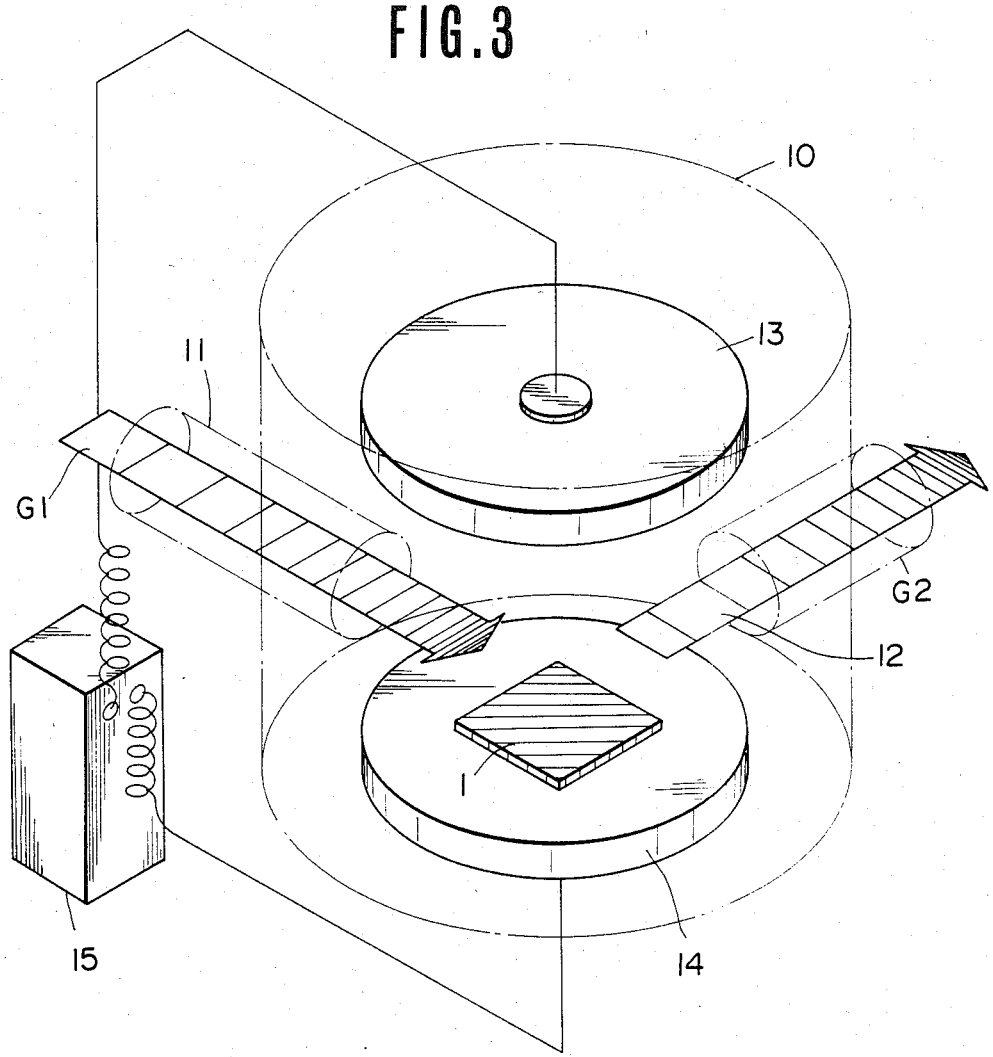
FIG. 3 is a schematic perspective view illustrating the formation of a passivation film which is a step in the process according to the present invention.

Referring to FIG. 3, the image sensor 1 is placed on an electrode plate 14 in a reaction chamber 10. The distance between the electrode plate 14 and electrode plate 13 opposed thereto is 40 mm, and a radio frequency potential of 13.6 MHz, 100 to 200 W is applied from a power source 15 to the gap between the electrode plates 13 and 14. In this case, the temperature of the substrate 2 is 200° to 300° C., and the pressure in the reaction chamber 10 is 0.5 to 1.5 Torr. The reaction chamber 10 is arranged such that a mixed gas consisting of silane ($SiH_4$) and nitrous oxide ($N_2O$) flows through an intake port 11 thereinto as indicated by an arrow G1, as the reactive gas required for forming the silicon oxide film 6, whereas the waste gas flows out through an exhaust port 12, as indicated by an arrow G2. In general, the intake port 11 is incorporated in the electrode plate 13, and the reactive gas flows through a number of intake holes bored through the electrode plate 13 into the reaction chamber 10.

In the present embodiment, the ratio of the flow of nitrous oxide gas to that of silane gas is adjusted to be within the range of 20:1 to 80:1. That is, nitrous oxide gas is in excess as compared with silane gas. Because of the excess nitrous oxide gas, hydrogen contained in the silane gas is allowed to combine with oxygen contained in the nitrous oxide gas to produce water, thus preventing any change in the properties of the ITO film by extra hydrogen radicals. Nitrogen contained in the nitrous oxide gas is incorporated into the passivation film 6 in a proportion of 0 to 10 atom percent, which will not cause a problem because nitrogen contributes to improvement in humidity resistance of the passivation film 6.

It is to be noted that an inert gas such as argon (Ar), helium (He) or the like may be further added as a carrier gas to an admixed gas of silane, nitrous oxide, and ammonia employed in the present embodiment.

The silicon oxide film 6 is formed under such conditions of temperature, pressure, voltage, and mixed gas as described above. The sensor 1 covered with the silicon oxide film 6 thus formed is subjected to a Pressure Cook test for 30 minutes under conditions of 120° C. and 2 atm. In the following table, the light/dark current ratio of the sensor 1 before and after covering the same with the silicon oxide film 6 as well as after the above Pressure Cook test is given.

TABLE

|  | Light Current | Dark Current | Light/Dark Current Ratio |
| --- | --- | --- | --- |
| Before Covering Sensor With Silicon Oxide Film 6 | $9.0 \times 10^{-10}$ A | $1.8 \times 10^{-13}$ A | 5000 |
| After Covering Sensor With Silicon Oxide Film 6 | $8.5 \times 10^{-10}$ A | $2.8 \times 10^{-13}$ A | 3000 |
| After Pressure Cook Test | $8.5 \times 10^{-10}$ A | $2.9 \times 10^{-13}$ A | 3000 |

In the table, the light current equals a value obtained by subtracting the dark current from the current flowing through the image sensor 1 when a bias voltage of −5 V is applied to the transparent upper electrode 5 of the sensor 1 and light of 100 lx emitted from a green fluorescent lamp is used during measurement of the photocurrent, and the light/dark current ratio equals a value obtained by dividing the light current value by dark current value. As is apparent from the table, the photocurrent decreased by around 6% after covering the image sensor 1 with the silicon oxide film 6, whilst the dark current increased, so that the light/dark current ratio decreased. Such a decrease in the photocurrent may be considered to be due to the reflection of light at the surface of the silicon oxide film 6 as well as at the interfacial boundary between the silicon oxide film 6 and the transparent upper electrode 5. However, thus problem can be removed by optimizing the thickness of the silicon oxide film 6. Furthermore, a light-/dark current ratio of 3000 is sufficient for practical use. Besides, there is no decrease in the light/dark current ratio of the image sensor after applying the Pressure Cook test.

It is to be understood that the present invention is applicable not only to production of an image sensor, but also to production of a photoelectric conversion device employed in solar cells and the like, and particularly the invention is effective for a device wherein a transparent electrode made of an ITO film is used on the surface by which light is received.

What is claimed is:

1. A process for forming a passivation film made of silicon oxide on the surface of a photoelectric conversion device having a layer of hydrogenated amorphous silicon between a transparent upper conductive electrode and a lower electrode on a substrate, and having a junction between said layer of hydrogenated amorphous silicon and said upper transparent conductive electrode, comprising the step of forming said passivation film by the plasma chemical vapor deposition method at a temperature lower than 300° C. in an atmosphere of mixed gas prepared by admixing an excess of oxygen-containing gas with silane gas.

2. A process for forming a passivation film as claimed in claim 1, wherein said oxygen-containing gas is selected from the group consisting of nitrous oxide, carbon dioxide, and oxygen.

3. A process for forming a passivation film as claimed in claim 1, wherein said oxygen-containing gas is admixed with said silane gas in a mixing ratio of 20:1 to 80:1.

4. A process for forming a passivation film as claimed in claim 1, wherein said transparent conductive electrode is made of indium-tin oxide.

5. A process for forming a passivation film as claimed in claim 1, wherein said mixed gas contains an inert gas such as argon, helium, or the like as a carrier gas.

6. A photoelectric conversion device having a layer of hydrogenated amorphous silicon between a transparent upper indium-tin oxide electrode and a lower electrode on a substrate, and having a junction between said layer of hydrogenated amorphous silicon and said indium-tin oxide electrode, comprising a silicon oxide film covering the surface of said photoelectric conversion device formed by the plasma chemical vapor deposition method at a temperature lower than 300° C. in an atmosphere of mixed gas consisting of silane gas and an excess of oxygen-containing gas.

* * * * *